United States Patent [19]

Schlösser et al.

[11] Patent Number: 4,556,987
[45] Date of Patent: Dec. 3, 1985

[54] RECEIVER COMPRISING A SEARCH TUNING CIRCUIT

[75] Inventors: Theodoor A. J. Schlösser; Theodorus H. Smakman, both of Eindhoven, Netherlands

[73] Assignee: U.S. Philips Corporation, New York, N.Y.

[21] Appl. No.: 523,525

[22] Filed: Aug. 17, 1983

[30] Foreign Application Priority Data

Sep. 1, 1982 [NL] Netherlands ............... 8203414

[51] Int. Cl.$^4$ ............................................. H03J 7/18
[52] U.S. Cl. ................................................. 455/161
[58] Field of Search ............... 455/161, 165, 166, 168, 455/185, 186

[56] References Cited

U.S. PATENT DOCUMENTS

| 4,387,469 | 6/1983 | Miyazaki et al. | 455/165 |
| 4,392,247 | 7/1983 | Van Deursen | 455/166 |
| 4,430,753 | 2/1984 | Shiratani | 455/165 |

FOREIGN PATENT DOCUMENTS 2006577  5/1979  United Kingdom ............... 455/161

Primary Examiner—Jin F. Ng
Attorney, Agent, or Firm—Thomas A. Briody; William J. Streeter; Edward W. Goodman

[57] ABSTRACT

Receiver for a search tuning circuit which in a wave range effects a presearch operation to determine a receiving condition criterion and effects thereafter in that waverange a search operation to find a transmitter satisfying the receiving condition criterion, the receiver comprising a circuit (124) whereby the presearch operation is limited to a frequency range less than one fifth of the wave range and the subsequent search operation starts at a frequency which is removed by at least the receiver bandwidth from the transmitter last received when no receivable transmitter is detected during the presearch operation.

1 Claim, 1 Drawing Figure

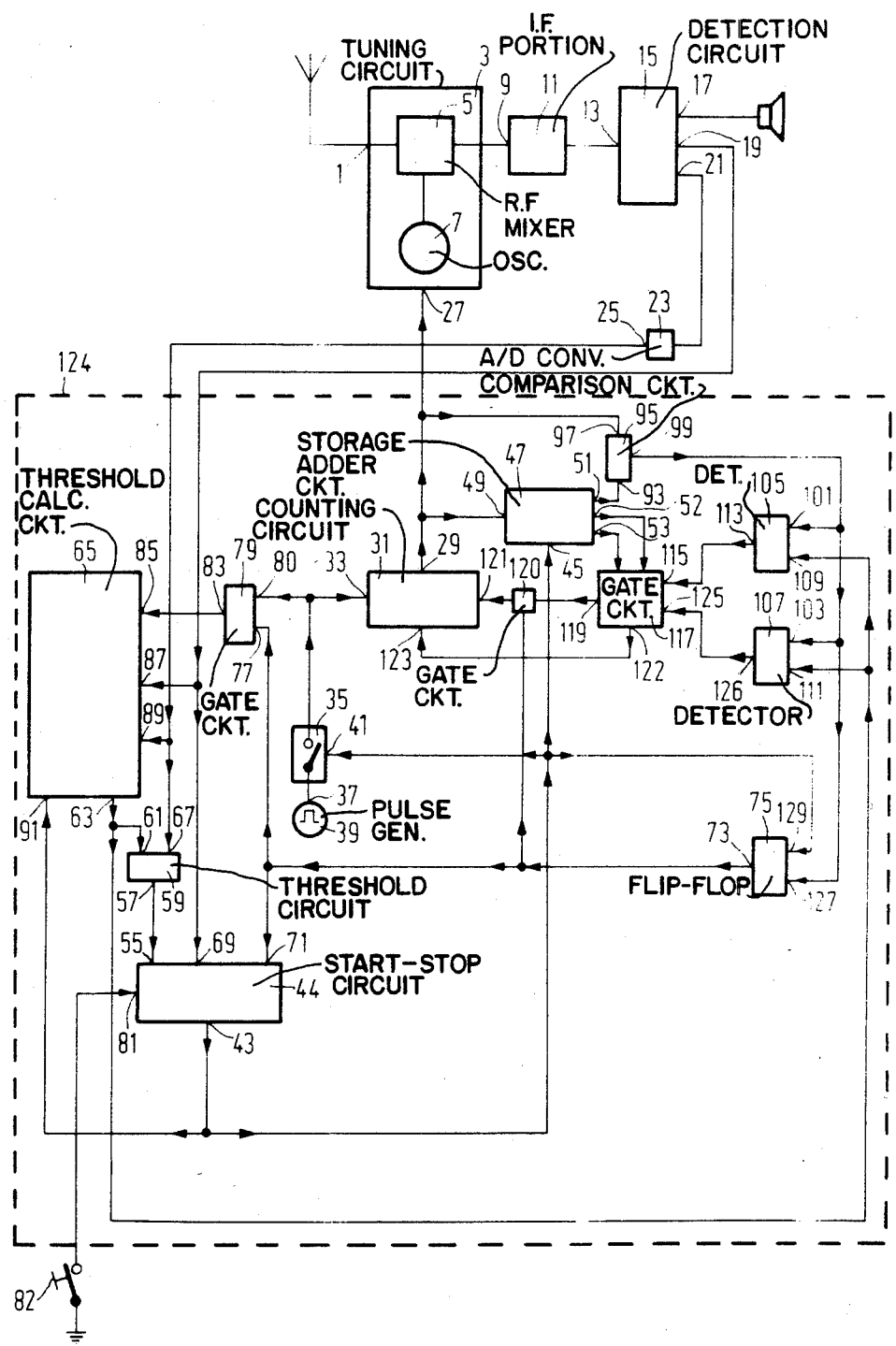

RECEIVER COMPRISING A SEARCH TUNING CIRCUIT

BACKGROUND OF THE INVENTION

The invention relates to a receiver comprising a search tuning circuit effecting in a wave band a presearch operation to determine a receiving condition criterion and effecting thereafter in that wave band a search operation to find a transmission which satisfies the receiving condition criterion.

United Kingdom Patent Application No. 2006577 A discloses a receiver of the above-mentioned type in which a wave band is searched during a presearch operation. This prior art receiver is intended to receive traffic information. The presearch operation is too slow for use in a receiver intended to receive radio broadcasts.

SUMMARY OF THE INVENTION

The invention has for its object to provide a receiver which is also suitable for receiving radio programs.

A receiver of the type described in the opening paragraph, is characterized in that the presearch operation is limited to a frequency range less than one fifth of the wave band and that the subsequent search operation starts at a frequency which is removed by at least the receiver bandwidth from the transmission received last when no receivable transmission is detected during the presearch operation. The receiver bandwidth being the frequency range over which the receiver is capable of tuning to a specific transmission.

Applicants have found that effecting a limited presearch operation near the frequency of the transmitter which was received last produces sufficient data to permit the determination of a threshold value for a search operation.

DESCRIPTION OF THE DRAWING

The invention will now be described in grater detail by way of example with reference to the accompaning drawing in which the sole FIGURE illustrates, by means of a concise block diagram, a receiver in accordance with the invention.

DESCRIPTION OF THE PREFERRED EMBODIMENT

A received signal is applied to an input 1 of a tuning circuit 3. The tuning circuit 3 comprises a radio-frequency and mixing portion 5 and an oscillator 7 and applies an intermediate-frequency signal to an input 9 of an intermediate-frequency portion 11 in which the intermediate-frequency signal is amplified and thereafter applied to an input 13 of a detection circuit 15.

The detection circuit 15 has an output 17, at which a low-frequency signal to be reproduced appears, an output 19, which supplies a signal which has a one level when the tuning circuit 3 is properly tuned to a received transmission and otherwise has a zero level, and an output 21, which supplies a signal which depends on the field strength of the received transmission.

The value of the field strength-dependent signal at the output 21 of the detection circuit 15 is converted by an analog-to-digital converter 23 into a digital value which is available at an output 25 thereof.

The tuning circuit 3 has an input combination 27, shown as one single input in the drawing, to which a digital signal combination, received from an output combination 29 of a counting circuit 31, is applied as tuning information. The tuning circuit 3 may comprise a frequency synthesizing circuit or a different circuit which is tunable by means of digital tuning information.

A counting signal input 33 of the counting circuit 31 is connected to an output 37 of a pulse generator 39 via a switch 35. When the switch 35 is closed, the counting circuit 31 counts the pulses produced by the pulse generator 39 and changes its counting position, in response to which the tuning of the tuning circuit 3 changes.

A control signal input 41 of the switch 35 receives from an output 43 of a start-stop circuit 44, a start-stop signal, which is also applied to a write signal input 45 of a storage and adder circuit 47. An input signal combination 49 of the storage and adder circuit 47 is connected to the output combination 29 of the counting circuit 31. When the start-stop signal closes the switch 41, the counting position of the counting circuit 31 is written into the storage and adder circuit 47 by the start-stop signal.

Then there becomes available at an output combination 51 of the storage and adder circuit 47, a value (Xo+8B) wherein Xo is the counting position of the counting circuit 31 at the moment at which the switch 35 is closed, and the number 8B represents eight times the bandwidth of the receiver, wherein B is the number of pulses in the counting signal to be counted to detune the tuning portion over a frequency equal to the bandwidth of the receiver. An output combination 52 of the storage and adding circuit 47 then produces a value Xo and an output combination 53 produces a value (Xo+B).

The start-stop circuit 44 has an input 55 which is connected to an output 57 of a threshold circuit 59. A digital signal combination, which represents a threshold value and is supplied from an output combination 63 of a threshold-calculating circuit 65, is applied to an input combination 61 of the threshold circuit 59. An input combination 67 of the threshold circuit 59 is supplied with the field strength-dependent digital signal combination from the output combination 25 of the analog-to-digital converter 23. If the value of this signal exceeds the threshold value at the input combination 61, then the output 57 assumes a logic one level, if said value, is less than the threshold value then the output 57 assumes a logic zero level.

The signal supplied from the output 19 of the detection circuit 15 is applied to a second input 69 of the start-stop circuit 44 and a signal which has the logic zero level when a presearch operation is effected and a logic one level when no presearch operation is effected, is applied to a third input 71 of the start-stop circuit 44. This signal is supplied from an output 73 of a presearch operation detector 75, in the form of a flip-flop, and is also applied to an input 77 of a gate circuit 79, a further input 80 of which is connected to the switch 35.

A fourth input 81 of the start-stop circuit 44 can be connected to ground by means of a switch 82 for manually starting a search operation preceded by a presearch operation.

An output 83 of the gate circuit 79 is connected to an input 85 of the threshold calculating circuit 65.

During a presearch operation, the gate circuit 79 conveys the pulses produced by the pulse generator 39 to the threshold-calculating circuit 65. These pulses are used as a clock signal for a storage circuit provided in the threshold-calculating circuit 65.

In addition, an input 87 of the threshold-calculating circuit 65 is connected to the output 19 of the detection circuit 15 and an input combination 89 is connected to the output combination 25 of the analog-to-digital converter 23. A reset input 91 of the threshold-calculating circuit 65 receives the start-stop signal from the output 43 of the start-stop circuit 44. As a result thereof, the storage circuit of the threshold-calculating circuit 65 is cleared at the start of a presearch operation by the start-stop signal.

If a receiving condition in which a received transmission is tuned to, is taken as the starting point, then, on closing of the switch 82, the output 43 of the start-stop circuit 44 becomes logic zero, which causes a presearch operation to start and the store of the threshold-calculating circuit 65 to be cleared.

At the moment the presearch operation is started, the counting circuit 31 has a counting position Xo which is then, as described above, stored in the storage and adder circuit 47 which results in a value (Xo+8B) at the output 51 of this storage and adder circuit, a value Xo at the output 52 and a value (Xo+B) at the output 53.

During the presearch operation, in response to the signals at the inputs 85, 87 and 89 of the threshold-calculating circuit 65 the values of the field strength of received transmissions are stored and used to calculate a threshold value which becomes available at the output 63.

The output combination 51 of the storage and adder circuit 47 is connected to an input combination 93 of a comparison circuit 95, a further input combination 97 of which is connected to the output combination 29 of the counting circuit 31.

An output 99 of the comparison circuit 95 becomes logic one (when X=Xo+8B) and applies this signal to an input 101 and 103, respectively, of a first and second end-of-presearch operation detector 105 and 107, respectively, to whose respective inputs 109 and 111 the threshold value signal from the output 63 of the threshold-calculating circuit 65 is applied.

If during the presearch operation this threshold value becomes larger than zero, the first end-of-presearch operation detector 105 will supply a logic one signal from an output 113 on reaching the counting position (Xo+8B). This output 113 applies this signal to an input 115 of a gate circuit 117, an output 119 of which is connected via a gate circuit 120 to a write command signal input 121 of the counting circuit 31. The gate circuit 120 is operated by the output signal of the flip-flop 75. An output combination 122 of the gate circuit 117 is connected to a counting position input combination 123 of the counting circuit 31. In response to the write signal transmitted by the gate circuit 120, the counting circuit 31 then assumes the position Xo in response to the signal combination obtained from the output combination 52 of the storage and adder circuit 47, which signal combination is conveyed by the gate circuit 117 and applied to the input combination 123 of the counting circuit. A search operation is then carried out from the counting position Xo.

If during the presearch operation, no transmission is detected, then the threshold value at the output 63 of the threshold-calculating circuit 65 remains zero and the second end-of-presearch operation detector 107 applies, on reaching of the counting position (Xo+8B) a logic one signal to an output 126 of this second end-of-presearch operation detector 107 for which output 126 is connected to a further input 125 of the gate circuit 117. The gate circuit 117 then conveys from its output combination 122 the position (Xo+B) supplied by the output combination 53 of the storage and adder circuit 47. In response to a signal at the output 1119 of the gate circuit 117, this position is then written into the counting circuit 31. A search operation is then carried out from the position (Xo+B).

At an end of a presearch operation, the end-of-presearch operation signal is applied from the output 99 of the comparison circuit 95 to a reset input 127 of the flip-flop 75, which was set at the start of the presearch operation in response to the start-stop signal applied to its input 129. The flip-flop 75 then supplies a logic one signal from its output 73. In response thereto, the input 71 of the start-stop circuit 44 connected thereto and the input 77 of the gate circuit 79 become logic one.

Immediately subsequent to the presearch operation, a search operation is then effected from Xo or (Xo+B), depending on the result of the presearch operation, which search operation ends when a transmission is received which applies to the input 67 of the threshold circuit 59 a signal having a value larger than the value at the output 63 of the threshold calculating circuit 65. After the flip-flop 75 has assumed its other state, the gate circuit 120 is blocked so that when the position (Xo+8B) is reached again, the counter position cannot be reset during the search operation to the position Xo or (Xo+B).

It has been found that a presearch operation can be limited to at least one-fifth of the frequency band which, in the F.M. frequency band, is to approximately 10 to 15 times the bandwidth of the receiver, and in the A.M. mid-wave band, is to approximately 6 to 9 times the bandwidth of the receiver.

It has further been found that the threshold value to be supplied by the threshold-calculating circuit from its output combination 63 can be limited to two values which are different from zero.

It will be obvious that a large number of the above-described functions of the receiver can be performed by a microprocessor with appropriate programming. The portion of the receiver suitable therefor is framed by an interrupted line 124.

For the sake of simplicity, any A.F.C. noise suppression or indication circuits are not described. It will be obvious that they can optionally be used, which also applies to, for example, circuits for temporarily stopping at received transmitters or for automatically starting the search tuning circuit when a received transmission no longer satisfies the receiving criterion.

In the embodiment shown the receiving condition criterion is assumed to be the situation in which the field strength of the transmission received exceeds the threshold value and the proper tuning to a received transmitter. It will be obvious that different criteria may be used, for example in which the pilot tone in the case of stereo reception is employed or an other signal suitable for that purpose.

What is claimed is:

1. A receiver having a search tuning circuit and means for effecting a presearch operation in a desired wave-band for establishing a receiving condition criterion for use in a subsequent search operation by said search tuning circuit to locate a transmission which satisfies said receiving condition criterion, characterized in that said means for effecting a presearch operation comprises means for limiting said presearch operation to a frequency range less than one-fifth of said desired wave-band, and means for initiating said subsequent search operation either at the frequency of a transmission received last prior to said presearch operation, when at least one transmission satisfying the receiving condition criterion is detected during the presearch operation, or at a frequency which is removed by at least one receiver bandwidth from the transmission received last prior to said presearch operation when no receiving condition criterion is detected during the presearch operation, the receiver bandwidth being the frequency range over which the receiver is capable of tuning to a specific transmission.

* * * * *